United States Patent
Hsu et al.

(10) Patent No.: US 9,246,015 B2
(45) Date of Patent: Jan. 26, 2016

(54) VERTICAL CHANNEL TRANSISTOR STRUCTURE AND MANUFACTURING METHOD THEREOF

(75) Inventors: Tzu-Hsuan Hsu, Jhongpu Township (TW); Yen-Hao Shih, Elmsford, NY (US); Chia-Wei Wu, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 853 days.

(21) Appl. No.: 12/892,044

(22) Filed: Sep. 28, 2010

(65) Prior Publication Data

US 2011/0012192 A1  Jan. 20, 2011

Related U.S. Application Data

(62) Division of application No. 11/545,575, filed on Oct. 11, 2006, now Pat. No. 7,811,890.

(51) Int. Cl.
   *H01L 29/66* (2006.01)
   *H01L 29/792* (2006.01)
   *H01L 27/115* (2006.01)
   (Continued)

(52) U.S. Cl.
   CPC .......... *H01L 29/792* (2013.01); *H01L 27/115* (2013.01); *H01L 27/11568* (2013.01); *H01L 29/42352* (2013.01); *H01L 27/1203* (2013.01)

(58) Field of Classification Search
   CPC .......... H01L 27/115; H01L 27/11568; H01L 29/792; H01L 29/7926; H01L 29/4234; H01L 29/42352; H01L 27/1203; H01L 27/1211
   USPC .......................... 257/328, E29.262, E21.679
   See application file for complete search history.

(56) References Cited

U.S. PATENT DOCUMENTS 4,630,086 A   12/1986   Sato et al.
4,959,812 A    9/1990   Momodomi et al.
(Continued)

FOREIGN PATENT DOCUMENTS

EP   0016246 A1   10/1980
EP   1411555 A2    4/2004
(Continued)

OTHER PUBLICATIONS

Huff, H.R. And Bevan, M., assemblers, "Questions at the International Workshop on Gate Insulators," Ad Hoc Meeting on High-k Gate Dielectricsat the Semiconductor Interface Specialists Conference, Nov. 30, 2001, 3 pages.
(Continued)

*Primary Examiner* — Stephen W Smoot
*Assistant Examiner* — Vicki B Booker
(74) *Attorney, Agent, or Firm* — Kenta Suzue; Haynes Beffel & Wolfeld LLP

(57) ABSTRACT

A vertical channel transistor structure is provided. The structure includes a substrate, a channel, a cap layer, a charge trapping layer, a source and a drain. The channel is formed in a fin-shaped structure protruding from the substrate. The cap layer is deposited on the fin-shaped structure. The cap layer and the fin-shaped structure have substantially the same width. The charge trapping layer is deposited on the cap layer and on two vertical surfaces of the fin-shaped structure. The gate is deposited on the charge trapping layer and on two vertical surfaces of the fin-shaped structure. The source and the drain are respectively positioned on two sides of the fin-shaped structure and opposite the gate.

6 Claims, 12 Drawing Sheets

(51) Int. Cl.
*H01L 29/423* (2006.01)
*H01L 27/12* (2006.01)

(56) References Cited

U.S. PATENT DOCUMENTS

| | | | |
|---|---|---|---|
| 5,270,969 A | 12/1993 | Iwahashi et al. |
| 5,278,439 A | 1/1994 | Ma et al. |
| 5,286,994 A | 2/1994 | Ozawa et al. |
| 5,319,229 A | 6/1994 | Shimoji et al. |
| 5,355,464 A | 10/1994 | Fandrich et al. |
| 5,408,115 A | 4/1995 | Chang |
| 5,412,603 A | 5/1995 | Schreck et al. |
| 5,424,569 A | 6/1995 | Prall |
| 5,448,517 A | 9/1995 | Iwahashi et al. |
| 5,483,486 A | 1/1996 | Javanifard et al. |
| 5,485,422 A | 1/1996 | Bauer et al. |
| 5,509,134 A | 4/1996 | Fandrich et al. |
| 5,515,324 A | 5/1996 | Tanaka et al. |
| 5,566,120 A | 10/1996 | D'Souza |
| 5,602,775 A | 2/1997 | Vo |
| 5,644,533 A | 7/1997 | Lancaster et al. |
| 5,668,029 A | 9/1997 | Huang et al. |
| 5,694,356 A | 12/1997 | Wong et al. |
| 5,745,410 A | 4/1998 | Yiu et al. |
| 5,753,950 A | 5/1998 | Kojima et al. |
| 5,768,192 A | 6/1998 | Eitan |
| RE35,838 E | 7/1998 | Momodomi et al. |
| 5,835,396 A | 11/1998 | Zhang |
| 5,877,054 A | 3/1999 | Yamauchi et al. |
| 5,883,409 A | 3/1999 | Guterman et al. |
| 5,895,949 A | 4/1999 | Endoh et al. |
| 5,952,692 A | 9/1999 | Nakazato et al. |
| 5,966,603 A | 10/1999 | Eitan et al. |
| 5,981,404 A | 11/1999 | Sheng et al. |
| 6,011,725 A | 1/2000 | Eitan |
| 6,026,026 A | 2/2000 | Chan et al. |
| 6,034,896 A | 3/2000 | Ranaweera et al. |
| 6,074,917 A | 6/2000 | Chang et al. |
| 6,096,603 A | 8/2000 | Chang et al. |
| 6,103,572 A | 8/2000 | Kirihara |
| 6,151,248 A | 11/2000 | Harari et al. |
| 6,169,693 B1 | 1/2001 | Chan et al. |
| 6,172,907 B1 | 1/2001 | Jenne |
| 6,194,272 B1 | 2/2001 | Sung et al. |
| 6,215,148 B1 | 4/2001 | Eitan |
| 6,218,700 B1 | 4/2001 | Papadas et al. |
| 6,219,276 B1 | 4/2001 | Parker |
| 6,297,096 B1 | 10/2001 | Boaz |
| 6,320,786 B1 | 11/2001 | Chang et al. |
| 6,322,903 B1 | 11/2001 | Siniaguine et al. |
| 6,356,478 B1 | 3/2002 | McCollum |
| 6,363,013 B1 | 3/2002 | Lu et al. |
| 6,396,741 B1 | 5/2002 | Bloom et al. |
| 6,436,768 B1 | 8/2002 | Yang et al. |
| 6,458,642 B1 | 10/2002 | Yeh et al. |
| 6,487,114 B2 | 11/2002 | Jong et al. |
| 6,512,696 B1 | 1/2003 | Fan et al. |
| 6,522,585 B2 | 2/2003 | Pasternak |
| 6,538,923 B1 | 3/2003 | Parker |
| 6,552,386 B1 | 4/2003 | Wu et al. |
| 6,566,699 B2 | 5/2003 | Eitan et al. |
| 6,587,903 B2 | 7/2003 | Roohparvar |
| 6,614,070 B1 | 9/2003 | Hirose et al. |
| 6,614,694 B1 | 9/2003 | Yeh et al. |
| 6,617,639 B1 | 9/2003 | Wang et al. |
| 6,642,090 B1 | 11/2003 | Fried et al. |
| 6,643,181 B2 | 11/2003 | Sofer et al. |
| 6,643,185 B1 | 11/2003 | Wang et al. |
| 6,645,813 B1 | 11/2003 | Hsieh et al. |
| 6,646,924 B1 | 11/2003 | Tsai et al. |
| 6,653,733 B1 | 11/2003 | Gonzalez et al. |
| 6,657,252 B2 | 12/2003 | Fried et al. |
| 6,657,894 B2 | 12/2003 | Yeh et al. |
| 6,670,240 B2 | 12/2003 | Ogura et al. |
| 6,670,671 B2 | 12/2003 | Sasago et al. |
| 6,674,138 B1 | 1/2004 | Halliyal et al. |
| 6,677,200 B2 | 1/2004 | Lee et al. |
| 6,690,601 B2 | 2/2004 | Yeh et al. |
| 6,709,928 B1 | 3/2004 | Jenne et al. |
| 6,714,457 B1 | 3/2004 | Hsu et al. |
| 6,720,630 B2 | 4/2004 | Mandelman et al. |
| 6,734,065 B2 | 5/2004 | Yim et al. |
| 6,744,105 B1 | 6/2004 | Chen et al. |
| 6,750,525 B2 | 6/2004 | Yim et al. |
| 6,768,158 B2 | 7/2004 | Lee et al. |
| 6,784,480 B2 | 8/2004 | Bhattacharyya |
| 6,795,357 B1 | 9/2004 | Liu et al. |
| 6,798,012 B1 | 9/2004 | Ma et al. |
| 6,812,075 B2 | 11/2004 | Fried et al. |
| 6,815,268 B1 | 11/2004 | Yu et al. |
| 6,815,805 B2 | 11/2004 | Weimer |
| 6,818,558 B1 | 11/2004 | Rathor et al. |
| 6,828,205 B2 | 12/2004 | Tsai et al. |
| 6,829,175 B2 | 12/2004 | Tsai et al. |
| 6,841,813 B2 | 1/2005 | Walker et al. |
| 6,856,551 B2 | 2/2005 | Mokhlesi et al. |
| 6,858,899 B2 | 2/2005 | Walker et al. |
| 6,858,906 B2 | 2/2005 | Lee et al. |
| 6,885,044 B2 | 4/2005 | Ding |
| 6,888,750 B2 | 5/2005 | Walker et al. |
| 6,897,533 B1 | 5/2005 | Yang et al. |
| 6,912,163 B2 | 6/2005 | Zheng et al. |
| 6,924,178 B2 | 8/2005 | Beintner |
| 6,925,007 B2 | 8/2005 | Harari et al. |
| 6,933,555 B2 | 8/2005 | Hsieh et al. |
| 6,937,511 B2 | 8/2005 | Hsu et al. |
| 6,942,320 B2 | 9/2005 | Chung et al. |
| 6,970,383 B1 | 11/2005 | Han et al. |
| 6,977,201 B2 | 12/2005 | Jung et al. |
| 6,995,424 B2 | 2/2006 | Lee et al. |
| 6,996,011 B2 | 2/2006 | Yeh et al. |
| 7,005,366 B2 | 2/2006 | Chau et al. |
| 7,012,297 B2 | 3/2006 | Bhattacharyya |
| 7,018,895 B2 | 3/2006 | Ding |
| 7,026,682 B2 | 4/2006 | Chung et al. |
| 7,042,045 B2 | 5/2006 | Kang et al. |
| 7,057,234 B2 | 6/2006 | Tiwari |
| 7,071,061 B1 | 7/2006 | Pittikoun et al. |
| 7,075,820 B2 | 7/2006 | Yamada et al. |
| 7,075,828 B2 | 7/2006 | Lue et al. |
| 7,106,625 B2 | 9/2006 | Yeh |
| 7,115,469 B1 | 10/2006 | Halliyal et al. |
| 7,115,942 B2 | 10/2006 | Wang |
| 7,120,059 B2 | 10/2006 | Yeh |
| 7,129,538 B2 | 10/2006 | Lee et al. |
| 7,133,313 B2 | 11/2006 | Shih |
| 7,133,317 B2 | 11/2006 | Liao et al. |
| 7,135,734 B2 | 11/2006 | Eldridge et al. |
| 7,151,692 B2 | 12/2006 | Wu |
| 7,154,143 B2 | 12/2006 | Jung et al. |
| 7,154,779 B2 | 12/2006 | Mokhlesi et al. |
| 7,157,769 B2 | 1/2007 | Forbes |
| 7,158,420 B2 | 1/2007 | Lung |
| 7,164,603 B2 | 1/2007 | Shih et al. |
| 7,166,513 B2 | 1/2007 | Hsu et al. |
| 7,187,590 B2 | 3/2007 | Zous et al. |
| 7,190,614 B2 | 3/2007 | Wu |
| 7,209,386 B2 | 4/2007 | Yeh |
| 7,209,389 B2 | 4/2007 | Lung et al. |
| 7,209,390 B2 | 4/2007 | Lue et al. |
| 7,242,622 B2 | 7/2007 | Hsu et al. |
| 7,250,646 B2 | 7/2007 | Walker et al. |
| 7,262,084 B2 | 8/2007 | Zhu et al. |
| 7,279,740 B2 | 10/2007 | Bhattacharyya et al. |
| 7,298,004 B2 | 11/2007 | Specht et al. |
| 7,314,787 B2 | 1/2008 | Yagishita |
| 7,352,018 B2 * | 4/2008 | Specht et al. .................. 257/204 |
| 2001/0012663 A1 | 8/2001 | Magri' et al. |
| 2001/0045615 A1 | 11/2001 | Ajit |
| 2001/0055838 A1 | 12/2001 | Walker et al. |
| 2002/0142252 A1 | 10/2002 | Ng |
| 2002/0167844 A1 | 11/2002 | Han et al. |
| 2002/0179958 A1 | 12/2002 | Kim |
| 2003/0023603 A1 | 1/2003 | Ellison et al. |

(56) References Cited

U.S. PATENT DOCUMENTS

| | | |
|---|---|---|
| 2003/0025147 A1 | 2/2003 | Nomoto et al. |
| 2003/0030100 A1 | 2/2003 | Lee et al. |
| 2003/0032242 A1 | 2/2003 | Lee et al. |
| 2003/0036250 A1 | 2/2003 | Lin et al. |
| 2003/0042534 A1 | 3/2003 | Bhattacharyya |
| 2003/0047755 A1 | 3/2003 | Lee et al. |
| 2003/0067032 A1 | 4/2003 | Caprara et al. |
| 2003/0146465 A1 | 8/2003 | Wu |
| 2003/0185055 A1 | 10/2003 | Yeh et al. |
| 2003/0224564 A1 | 12/2003 | Kang et al. |
| 2003/0232507 A1 | 12/2003 | Chen |
| 2004/0079983 A1 | 4/2004 | Chae et al. |
| 2004/0084714 A1 | 5/2004 | Ishii et al. |
| 2004/0125629 A1 | 7/2004 | Scheuerlein et al. |
| 2004/0145024 A1 | 7/2004 | Chen et al. |
| 2004/0159910 A1 | 8/2004 | Fried et al. |
| 2004/0183126 A1 | 9/2004 | Bae et al. |
| 2004/0207002 A1 | 10/2004 | Ryu et al. |
| 2004/0251487 A1 | 12/2004 | Wu et al. |
| 2004/0251489 A1 | 12/2004 | Jeon et al. |
| 2004/0256679 A1 | 12/2004 | Hu |
| 2005/0001258 A1 | 1/2005 | Forbes |
| 2005/0006696 A1 | 1/2005 | Noguchi et al. |
| 2005/0023603 A1 | 2/2005 | Eldridge et al. |
| 2005/0062091 A1 | 3/2005 | Ding |
| 2005/0062098 A1 | 3/2005 | Mahajani et al. |
| 2005/0074937 A1 | 4/2005 | Jung |
| 2005/0093054 A1 | 5/2005 | Jung |
| 2005/0218522 A1 | 10/2005 | Nomoto et al. |
| 2005/0219906 A1 | 10/2005 | Wu |
| 2005/0226047 A1 | 10/2005 | Hieda et al. |
| 2005/0227435 A1 | 10/2005 | Oh et al. |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0255652 A1 | 11/2005 | Nomoto et al. |
| 2005/0270849 A1 | 12/2005 | Lue |
| 2005/0272190 A1 | 12/2005 | Lee et al. |
| 2005/0281085 A1 | 12/2005 | Wu |
| 2006/0007732 A1 | 1/2006 | Yeh |
| 2006/0029887 A1 | 2/2006 | Oh et al. |
| 2006/0044872 A1 | 3/2006 | Nazarian |
| 2006/0088983 A1 | 4/2006 | Fujisawa et al. |
| 2006/0097310 A1 | 5/2006 | Kim et al. |
| 2006/0115978 A1 | 6/2006 | Specht et al. |
| 2006/0118858 A1 | 6/2006 | Jeon et al. |
| 2006/0197145 A1 | 9/2006 | Pittikoun et al. |
| 2006/0198189 A1 | 9/2006 | Lue et al. |
| 2006/0198190 A1 | 9/2006 | Lue |
| 2006/0202252 A1 | 9/2006 | Wang et al. |
| 2006/0202256 A1 | 9/2006 | Harari |
| 2006/0202261 A1 | 9/2006 | Lue et al. |
| 2006/0234446 A1 | 10/2006 | Wei et al. |
| 2006/0258090 A1 | 11/2006 | Bhattacharyya et al. |
| 2006/0261401 A1 | 11/2006 | Bhattacharyya |
| 2006/0275986 A1 | 12/2006 | Kobayashi et al. |
| 2006/0281260 A1 | 12/2006 | Lue |
| 2006/0284245 A1 | 12/2006 | Park et al. |
| 2007/0012988 A1 | 1/2007 | Bhattacharyya |
| 2007/0029625 A1 | 2/2007 | Lue et al. |
| 2007/0031999 A1 | 2/2007 | Ho et al. |
| 2007/0032018 A1 | 2/2007 | Tuntasood et al. |
| 2007/0045718 A1 | 3/2007 | Bhattacharyya |
| 2007/0069283 A1 | 3/2007 | Shih et al. |
| 2007/0076477 A1 | 4/2007 | Hwang et al. |
| 2007/0096202 A1 | 5/2007 | Kang et al. |
| 2007/0120179 A1 | 5/2007 | Park et al. |
| 2007/0138539 A1 | 6/2007 | Wu et al. |
| 2008/0150029 A1 | 6/2008 | Zheng et al. |
| 2008/0265308 A1 | 10/2008 | Lee |
| 2009/0039417 A1 | 2/2009 | Chen et al. |

FOREIGN PATENT DOCUMENTS

| | | |
|---|---|---|
| EP | 1689002 A2 | 8/2006 |
| JP | H05-021808 | 1/1993 |
| JP | 09162313 A | 6/1997 |
| JP | 11040682 A | 2/1999 |
| JP | 11233653 A | 8/1999 |
| JP | 2004363329 | 12/2004 |
| JP | 2005-191451 A | 7/2005 |
| JP | 2005-294565 A | 10/2005 |
| JP | 2006-080163 A | 3/2006 |
| JP | 2006-216215 A | 8/2006 |
| KR | 20030020644 A | 3/2003 |
| WO | 9428551 A1 | 12/1994 |
| WO | 0137347 A1 | 5/2001 |
| WO | 2006011369 A1 | 2/2006 |

OTHER PUBLICATIONS

Hwang, Kiunn-Ren, et al., "20nm Gate Bulk-FinFET SONOS Flash," IEEE 2005, 4 pages.

Lusky, Eli et al., "Electron Discharge Model of Locally-Trapped Charge in Oxide—Nitride—Oxide (ONO) Gates for NROM Non-Volatile Semiconductor Memory Devices," SSDM, Tokyo, Japan (Sep. 2001), 2 pages.

Park, Chang Seo, et al., "Substituted Aluminum Metal Gate on High-K Dielectric for Low Work-Function and Fermi-Level Pinning Free," IEEE IEDM 2004, 12.4.1-12.4.4.

Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.

Rippard, W.H., et al., "Ultrathin Aluminum Oxide Tunnel Barriers," Phys. Rev. Lett. 88(4), Jan. 28, 2002, 4 pages.

Specht, M, et al. "Novel Dual Bit Tri-Gate Charge Trapping Memory Devices," IEEE IEDM 25(12), Dec. 2004, 3 pages.

Hsu, Tzu-Hsuan, et al., "A High-Speed BE-SONOS NAND Flash Utilizing the Field-Enhancement Effect of FinFET," IEEE IEDM, Dec. 10-12, 2007, 4 pages.

Lue, Hang-Ting, et al., "Study of Local Trapping and STI Edge Effects on Charge-Trapping NAND Flash," IEEE IEDM Dec. 10-12, 2007, 4 pages.

White et al., "On the Go with SONOS" IEEE Circuits and Devices, Jul. 21-31, 2000.

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38 (11) Nov. 1991 2519-2526.

Ito et al., "A Novel MNOS Techology Using Gate Hole Injection in Erase Operation for Embedded Nonvolatile Memory Applications," 2004 Symp. On VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

DiMaria, D.J., et al., "Conduction Studies in Silicon Nitride: Dark Currents and Photocurrents," IBM J. Res. Dev. May 1977, 227-244.

Yeh, C.C., et al., "Phines: A Novel Low Power Program/Erase, Small Pitch, 2-Bit per Cell Flash Memory," IEDM Tech Digest 2002, 931-934.

Buckley, J., et al., "Engineering of 'Conduction band-Crested Barriers' or 'Dielectric Constant-Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4; 2003.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4; 2003.

(56) References Cited

OTHER PUBLICATIONS

Baik, Seung, et al. "High Speed and Nonvolatile Si Nanocrystal Memory for Scaled Flash Technology using Highly Field-Sensitive Tunnel Barrier," IEEE IEDM 03-545, 22.3.1-22.3.4; 2003.

Lee, Chang, et al., "A Novel SONOS Structure of SiO2/SiN/Al2O3 with TaN Metal Gate for Multi-Giga Bit Flash Memeries," IEEE 2003, 4 pages.

Cho et al., "Simultaneous Hot-Hole Injection at Drain and Source for Efficient Erase and Excellent Endurance in SONOS Flash EEPROM Cells," IEEE Electron Device Lett., vol. 24, No., 4, Apr. 2003, 260-262.

Shih et al., "A Novel 2-bit/cell Nitride Storage Flash memory with Greater than 1M P/E-cycle Endurance," IEEE IEDM 2004, pp. 36.3.1-36.3.4.

Blomme, et al., "Multilayer tunneling barriers for nonvolatile memory applications," 60th Device Resarch Conf., 2002, Conf. Digest 153-154.

Blomme, et al., Write/Erase Cycling Endurance of Memory Cells with SiO2/HfO2 Tunnel Dielectric, IEEE Trans on Device and Materials Reliability, vol. 4, No. 3, Sep. 2004, 345-351.

Govoreanu, et al, "Variot: A Novel Multilayer Tunnel Barrier Concept for Low-Voltage Nonvolatile Memory Devices," IEEE Electron Device Lett., vol. 24, No. 2, Feb. 2003, 99-101.

Govoreanu et al., "Simulation of Nanofloating Gate Memory with High-k Stacked Dielectrics," IEEE SISPAD Int'l Conf. 305 Sep. 2003, 299-302.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Kim et al., "Robust Multi-bit Programmable Flash Memory Using a Resonant Tunnel Barrier," Electron Dev. Mtg. Dec. 5-7, 2005, IEDM Tech Dig. 861-864.

Likharev, "Layered tunnel barriers for nonvolatile memory devices," Applied Physics Lett, vol. 73, No. 15, Oct. 1998, 2137-2139.

Lue et al., "BE-SONOS: A Bandgap Engineered SONOS with Excellent Performance and Reliability," IEDM Tech Digest, IEEE Int'l Dec. 2005, 547-550.

Sung, et al., "Multi-layer SONOS with Direct Tunnel Oxide for High Speed and Long Retention Time," IEEE 2002 Nanoelectronics Workshop, Jun. 2002, 83-84.

Aminzadeh et al., "Conduction and Charge Trapping in Polysilicon—Silicon Nitride—Oxide—Silicon Structures under Positive Gate Bias," IEEE Transactions on Electron Devices, vol. 35, No. 4, Apr. 1998, 459-467.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

Tsai et al., "Novel SONOS-Type Nonvolatile Memory Device with Suitable Band Offset in HfAlO Charge-Trapping Layer," Int'l Symp. on VLSI Tech, Systems and Applications, Apr. 23-25, 2007, 2 pages.

Hijaya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Sasago, Y. et al., "90-nm-node multi-level AG-AND type flash memory with cell size of true 2 F/sup 2//bit and programming throughput of 10 MB/s," IEDM, 2003, pp. 823-826.

Fujiwara, I., et al., "0.13 .mu.m MONOS single transistor memory cell with deparated source lines," IEDM 1998, 995-998.

Chang, Kuo-Tung, et al., "A New SONOS Memory Using Source-Side Injection for Programming," IEEE Electron Device Letters, vol. 19, No. 7, Jul. 1998, 253-255.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Naruke, K., et al., "Nonvolatile Semiconductor Memories: Technologies, design and application," C. Hu. Ed., New York, IEEE Press, 1991, Ch. 5, pp. 183-186.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

Lee, Jae-Duk, et al., "Effects of Floating-Gate Interference on NAND Flash Memory Cell Operation," IEEE Electron Device Letters, vol. 23, No. 5, May 2002, 264-266.

Shin, Yoocheol, et al., "High Reliable SONOS-type NAND Flash Memory Cell with Al2O3 for Top Oxide," Non-Volatile Semiconductor Memory Workshop, 2003, 2 pages.

Aminzadeh et al., "Conduction and Charge Trapping in Polysilicon—Silicon Nitride—Oxide—Silicon Structures under Positive Gate Bias," IEEE Trans. on Electron Dev. 35 (4) Apr. 1998, 459-467.

Office Action in Corresponding Japanese Patent Application No. 2007-265550; mailed Nov. 27, 2012; 4 pp. (English translation attached).

Office Action in Corresponding Korean Patent Application No. 10-2007-0102047; mailed Oct. 7, 2013; 4 pp. (translation included).

\* cited by examiner

VERTICAL CHANNEL TRANSISTOR STRUCTURE AND MANUFACTURING METHOD THEREOF

RELATED APPLICATIONS

This application is a divisional of U.S. patent application Ser. No. 11/545,575 filed on 11 Oct. 2006, now U.S. Pat. No. 7,811,890, which application is incorporated herein by reference.

BACKGROUND OF THE INVENTION

1. Field of the Invention

The invention relates in general to a vertical channel transistor structure and a manufacturing method thereof, and more particularly to a vertical channel transistor structure with narrow channel and a manufacturing method therefor.

2. Description of the Related Art

Along with other advances in semiconductor manufacturing technology, the resolution of current semiconductor elements has reached the nanometer level. For example, the reduction in gate length and element pitch in memory units is carried on continually. Although the technology of photolithography has improved greatly, currently manufactured planar transistor structures have reached the limit of resolution, and the transistor elements manufactured thereby are apt to have the problems of electrostatic discharge (ESD), leakage, and decrease in electron mobility, resulting in short channel effect and drain induced barrier lowering (DIBL) effect. Thus, the double-gate or tri-gate vertical channel transistors capable of providing higher packing density, better carrier transport and device scalability, such as the fin field effect transistor (fin FET) for instance, have become transistor structures with great potential.

The fin FET transistor has a vertical channel that can be formed on the two lateral surfaces of the fin FET transistor and turns on the current by the double-gate or the tri-gate, hence having higher efficiency than conventional planar channel transistors.

When manufacturing a fin FET element with high resolution, expensive processes such as the photolithography process and the E-beam process are required. Therefore, the throughput can hardly be increased and large-scale production is difficult to achieve. There is another manufacturing method which reduces the channel width by applying oxidation to the etched channel. However, the element formed according to the above method has poor uniformity and unstable quality.

SUMMARY OF THE INVENTION

It is therefore an object of the invention to provide a vertical channel transistor structure and manufacturing method thereof. The fin-shaped structure whose width ranges between 10 nm~60 nm can be formed without changing the pitch of the element formed by way of exposing, such that the driving current for writing/reading data is effectively increased without incurring short channel effect or DIBL effect. The fin FET transistor formed according to the invention is small-sized, so the memory density can be improved significantly.

The invention achieves the above-identified object by providing a vertical channel transistor structure. The structure includes a substrate, a channel, a cap layer, a charge trapping layer, a source and a drain. The channel of the transistor structure is formed on a semiconductor body which protrudes from the substrate in a fin-shaped structure. The cap layer is deposited on the top of the fin-shaped structure. The cap layer and the fin-shaped structure have substantially the same width. The charge trapping layer is deposited on the cap layer and on two vertical surfaces of the fin-shaped structure. The gate straddles on the charge trapping layer and is positioned on the two vertical surfaces of the fin-shaped structure. The source and the drain are respectively positioned on two sides of the gate in the fin-shaped structure.

The invention further achieves the above-identified object by providing a manufacturing method of a vertical channel transistor structure. First, a substrate is provided. Next, a first SiN layer is formed on the substrate. Then, the SiN layer is etched to form a first patterned SiN layer. Next, the first patterned SiN layer is trimmed to form a second patterned SiN layer. Then, the substrate is etched to form at least a fin-shaped structure protruding from the substrate. Afterwards, a silicon oxide (SiO) layer is formed on top surface of the substrate. Next, an oxide-nitride-oxide (ONO) layer is formed on two vertical surfaces of the fin-shaped structure. Then, a gate material layer is formed on the ONO layer. Next, the gate material layer is etched to form at least a gate positioned on two lateral surfaces of the fin-shaped structure so that a straddle gate is formed over a vertical surface of the fin-shaped structure. Then, ions are implanted to two sides of the gate to form a source and a drain on the fin-shaped structure.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1A:
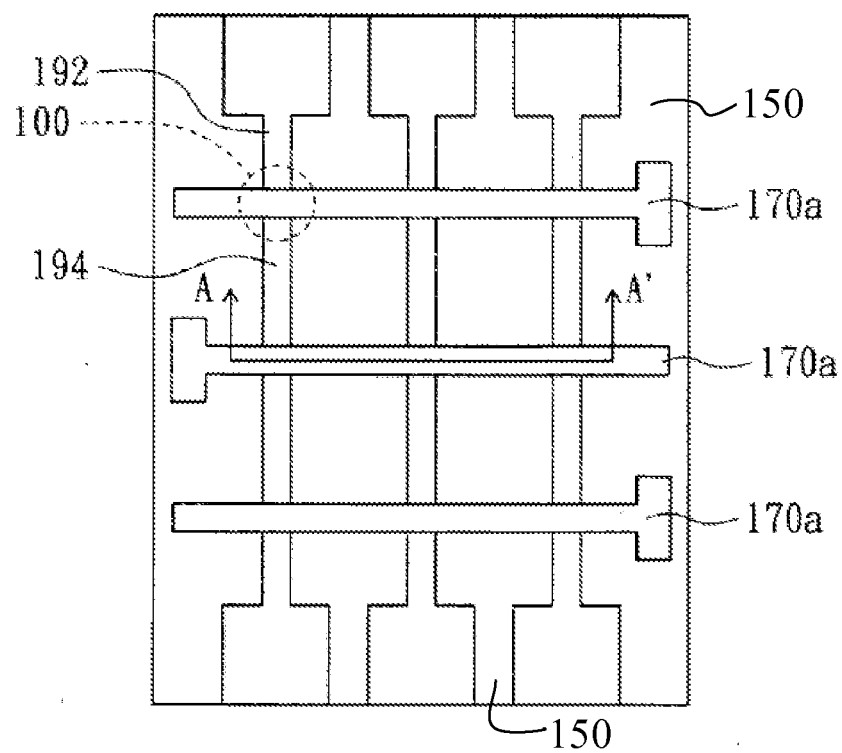
FIG. 1A is a top view of a vertical channel transistor structure according to a first embodiment of the invention.
Figure 1B:
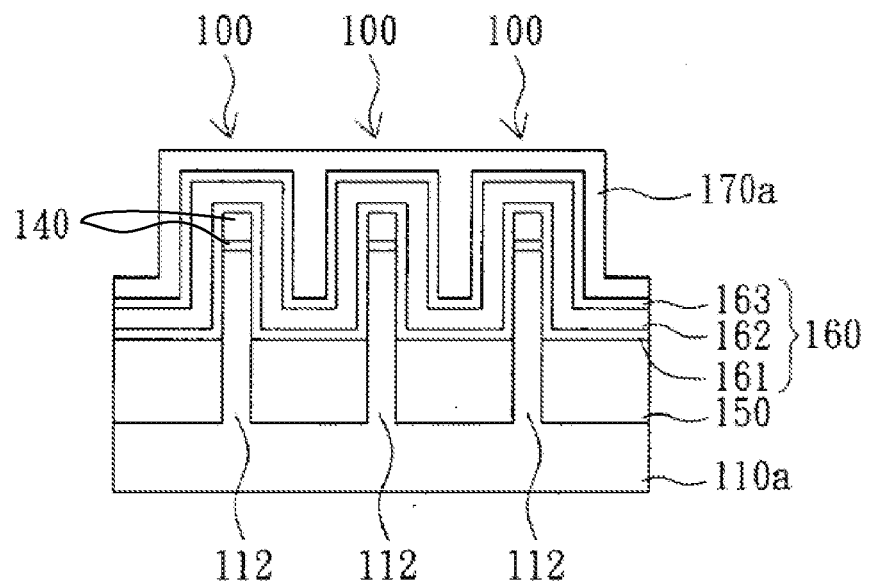
FIG. 1B is a cross-sectional view along a cross-sectional line AA' of FIG. 1A.

FIG. 1A is a top view of a vertical channel transistor structure according to a first embodiment of the invention. FIG. 1B is a cross-sectional view along a cross-sectional line AA' of FIG. 1A. As shown in FIG. 1B, the vertical channel transistor structure 100 includes a substrate 110a, a fin-shaped structure 112 protruding from the substrate 110a and a cap layer 140 deposited on the top of the fin-shaped structure 112. The cap layer 140 and the fin-shaped structure 112 have substantially the same width. In the present embodiment of the invention, the cap layer 140, an intermediate product during the manufacturing process, includes a silicon dioxide ($SiO_2$) layer and a silicon nitride (SiN) layer. The SiN layer is positioned on the $SiO_2$ layer. A charge trapping layer 162 is deposited on the cap layer 140 and straddles the fin-shaped structure 112. The charge trapping layer 162 is contained between a first SiO layer 161 and a second SiO layer 163. The first SiO layer 161 is positioned between the charge trapping layer 162 and the fin-shaped structure 112. The second SiO layer 163 is positioned between the charge trapping layer 162 and the gate 170a. The charge trapping layer 162 is made from SiN, aluminum oxide ($Al_2O_3$) or other material with high dielectric constant. In the present embodiment of the invention, the charge trapping layer 162 is made from SiN. The charge trapping layer 162, the first SiO layer 161 and the second SiO layer 163 together form an oxide-nitride-oxide (ONO) layer as a storage structure, such that the vertical channel transistor structure 100 has data-writing/data-erasing function. The gate straddles the charge trapping layer 162 and two vertical surfaces on the fin-shaped structure 112. The gate 170a can turn on the circuit on the two vertical surfaces of the fin-shaped structure 112, and the structure formed thereby is called the double-gate structure. The gate 170a can be made from N+ polysilicon, P+ polysilicon, or metal. As shown in FIG. 1A, the source 192 and the drain 194 are respectively positioned on the two sides of the gate 170a. The present embodiment of the invention is a NAND gate structure, so the source and the drain can be exchanged, and the source or the drain between any two vertical channel transistor structures 100 is not only a source for one transistor but also a drain for another. The line width of the fin-shaped structure 112 approximately ranges between 10 nm~60 nm.

As shown in FIG. 1B, the vertical channel transistor structure 100 further includes a thick SiO layer 150 positioned on the substrate 110a. The purpose of the thick SiO layer 150 is to prevent substrate being turned on to cause leakage.

The application of the present embodiment of the invention is exemplified below by the manufacturing process of a NAND memory. Referring to FIGS. 2A-2J, manufacturing procedures of the vertical channel transistor structure according to the first embodiment are shown. Also referring to FIG. 3, a step flowchart of manufacturing the vertical channel transistor structure according to the first embodiment is shown.

Figure 2A:
FIGS. 2A~2J are manufacturing procedures of the vertical channel transistor structure according to the first embodiment.
Figure 3:
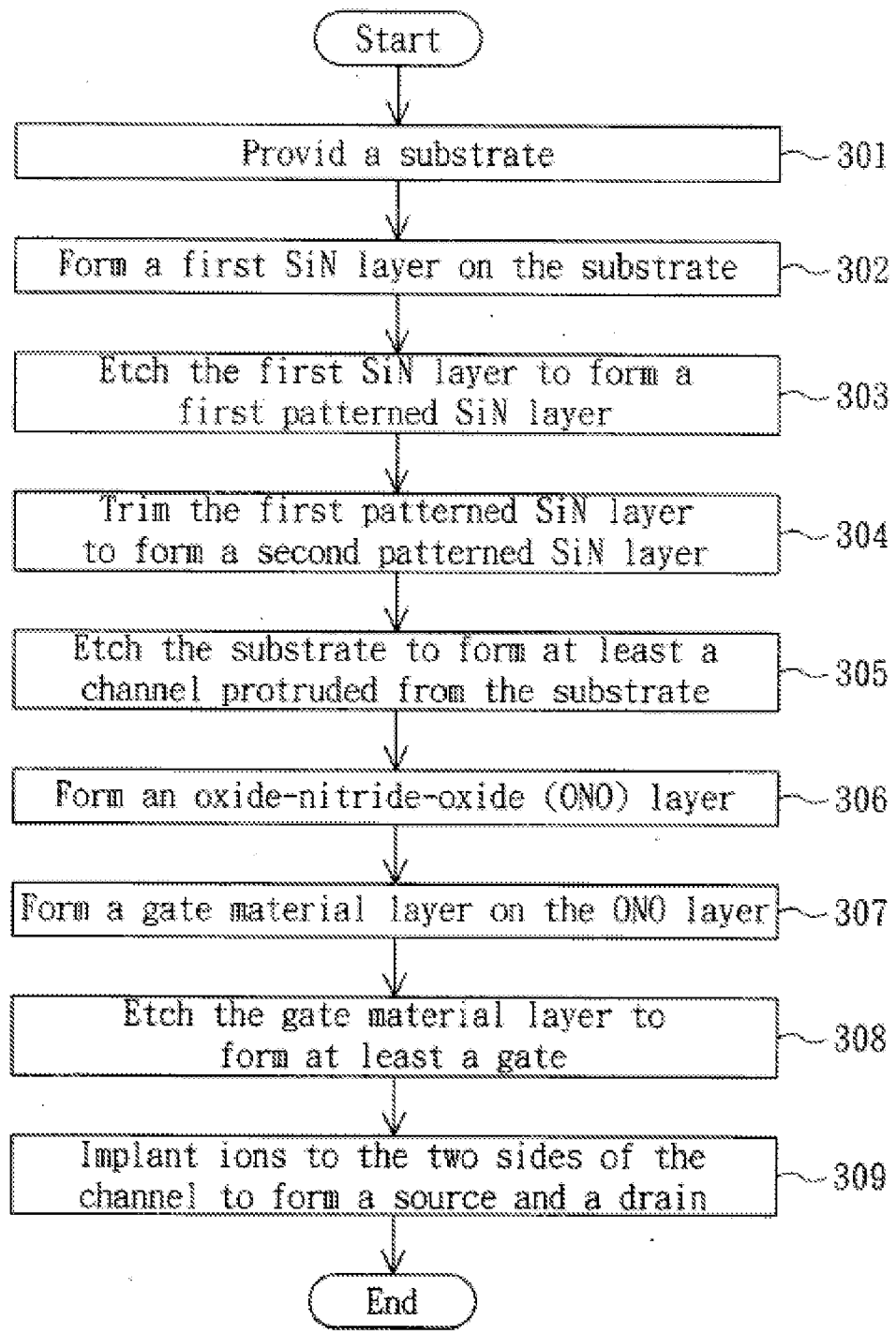
FIG. 3 is a step flowchart of manufacturing the vertical channel transistor structure according to the first embodiment.

First, referring to FIG. 2A, at step 301 a substrate 110 is provided. The substrate 110 can be a bulk silicon substrate or a silicon-on-insulator (SOI) substrate.

Figure 2B:
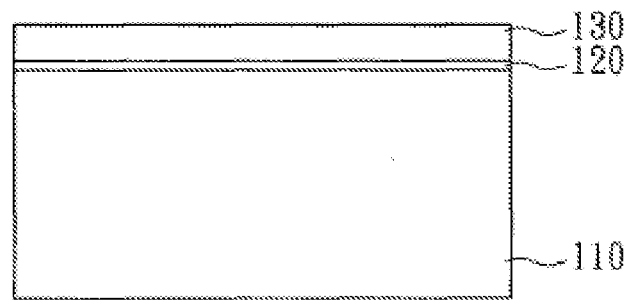

Next, referring to FIG. 2B, a first SiN layer 130 is formed on the substrate 110 as indicated in step 302. In the present embodiment of the invention, a pad SiO layer 120 is preferably formed between the substrate 110 and the first SiN layer 130. The present embodiment of the invention forms a transistor structure with N-type channel. Therefore, in the present step, P-type ions are implanted to the substrate 100 for enabling the substrate 100 to have better function in subsequent processing of forming the channel. However, the present embodiment of the invention is not limited thereto. If a transistor having P-type channel is to be formed, then N-type ions are implanted to the substrate 100.

Figure 2C:
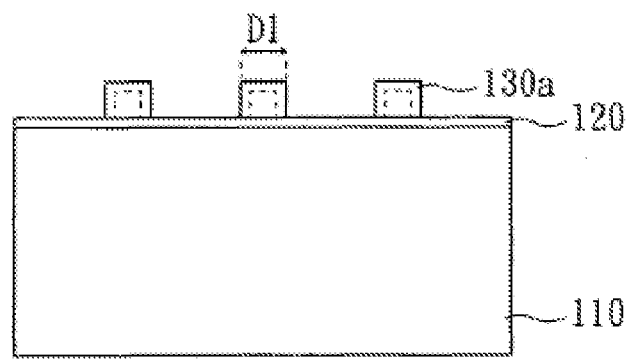

Then, referring to FIG. 2C, the first SiN layer 130 is etched to form a first patterned SiN layer 130a as indicated in step 303. Step 303 includes the sub-steps of forming a first patterned photoresist layer (not illustrated) on the first SiN layer 130; etching the first SiN layer 130 to form the first patterned SiN layer 130a; and removing the first patterned photoresist layer. The first patterned SiN layer 130a has a pattern with line width D1. The present step can be performed using a reactive ion etching (RIE) method.

Figure 2D:
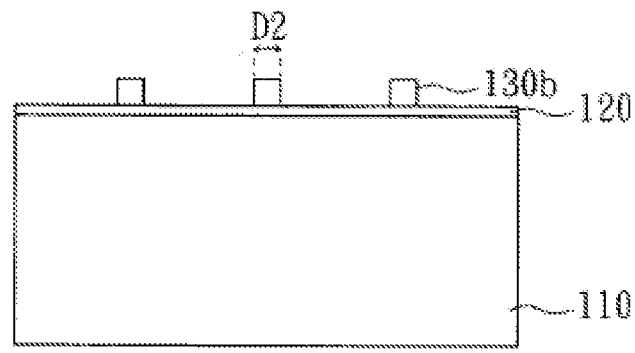

Next, referring to FIG. 2D, the first patterned SiN layer 130a is trimmed to form a second patterned SiN layer 130b as indicated in step 304. After the trimming process, the second patterned SiN layer 130b has a pattern with line width D2. The line width D2 approximately ranges between 10 nm~60 nm. Since the hot-phosphoric-acid (HDP) possesses excellent etching selectivity towards SiN and SiO, that is used to trim the first patterned SiN layer 130a in the present step.

Figure 2E:
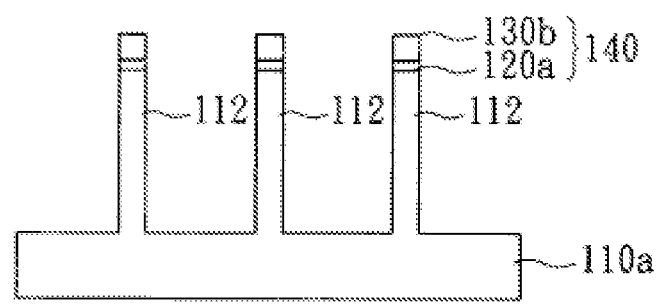

Referring to FIG. 2E, the substrate 110 is etched to form a substrate 110a first and form a fin-shaped structure 112 protruding from the substrate 110a as indicated in step 305. In the present embodiment of the invention, the pad SiO layer 120 is preferably etched to form a pad SiO layer 120a according to RIE method first, and then the substrate 110 is etched to form a fin-shaped structure 112 next. The pad SiO layer 120a and the second patterned SiN layer 130b together form the cap layer 140.

Figure 2F:
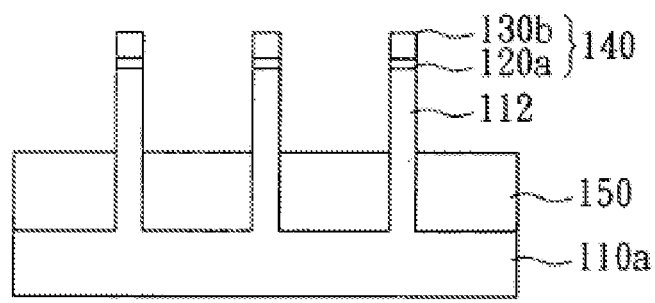

Next, referring to FIG. 2F, a thick SiO layer 150 contacting two lateral surfaces of the fin-shaped structure 112 is formed. In the present step, the thick SiO layer 150 is deposited by high density plasma (HDP) deposition. The thick SiO layer 150 restricts the height of a channel on the fin-shaped structure 112, such that the current can only flow through the part of the fin-shaped structure 112 above the thick SiO layer 150.

Figure 2G:
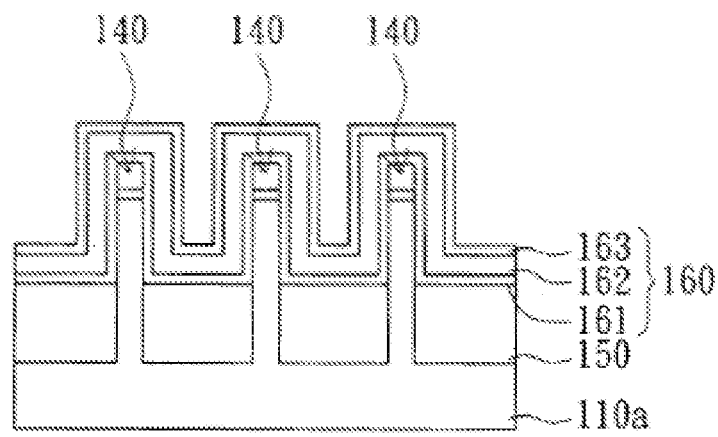

Then, referring to FIG. 2G, an oxide-nitride-oxide (ONO) layer 160 is formed as indicated in step 306. The ONO layer 160 is deposited on the cap layer 140, the two vertical surfaces of fin-shaped structure 112 and thick SiO layer 150. The ONO layer includes a first SiO layer 161, a charge trapping layer 162 and a second SiO layer 163. In the present embodiment of the invention, the charge trapping layer 162 is made from SiN, and can be replaced by aluminum oxide ($Al_2O_3$) or other high dielectric constant material.

Figure 2H:
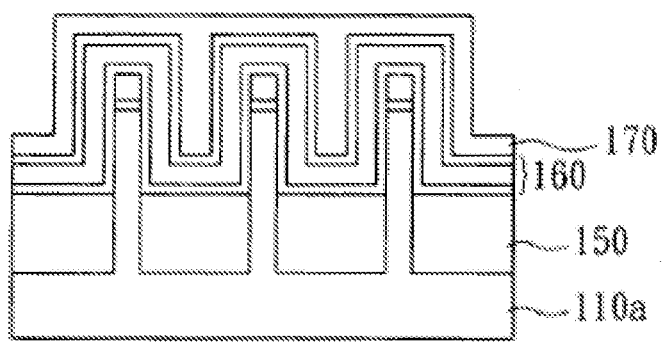

Next, referring to FIG. 2H, a gate material layer 170 is formed on the ONO layer 160 as indicated in step 307.

Figure 2I:
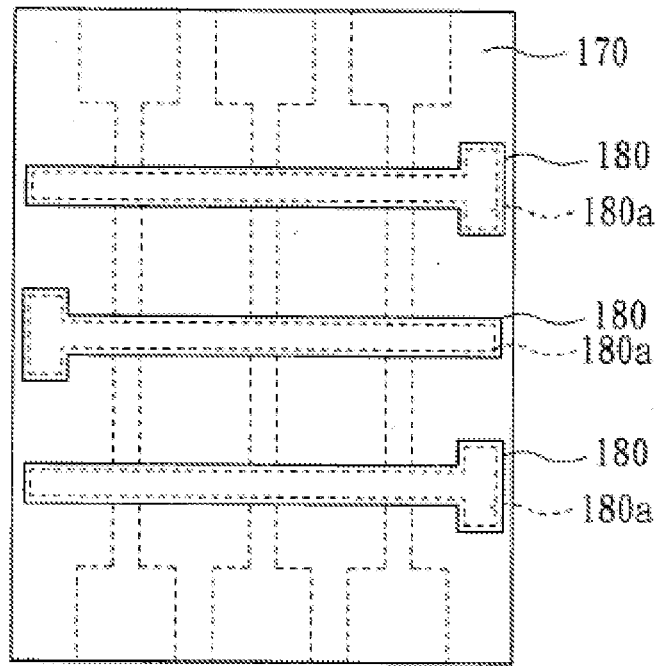
Figure 2J:
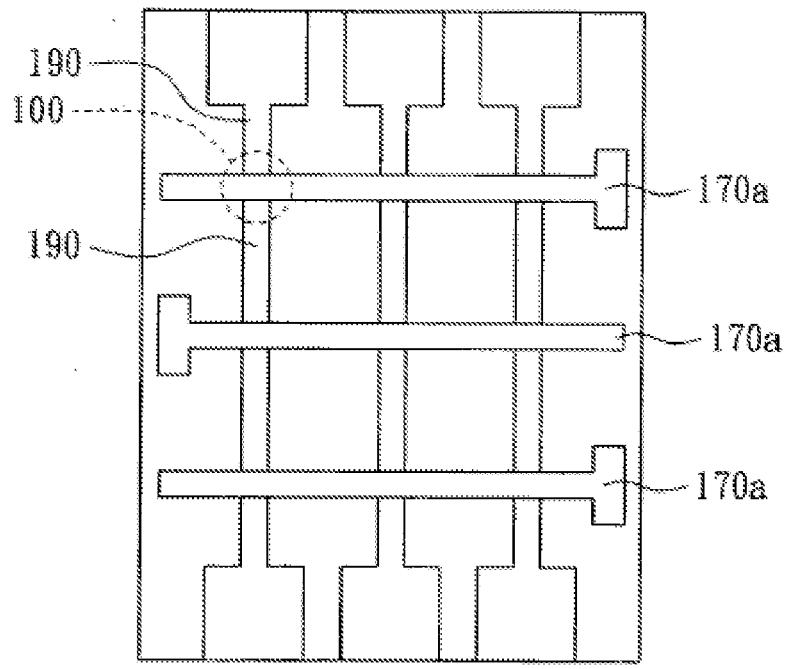

Then, referring to FIG. 2I, the gate material layer 170 is etched to form at least a gate straddling the fin-shaped structure 112 as indicated in step 308. Preferably, the following steps are performed before step 308. First, a second SiN layer (not illustrated) is formed on the gate material layer 170. Next, a second patterned photoresist layer (not illustrated) is formed on the second SiN layer. Then, the second SiN layer is etched to form a third patterned SiN layer 180. Next, the second patterned photoresist layer is removed. Then, the third patterned SiN layer 180 is trimmed to form a fourth patterned SiN layer 180a. Then, referring to FIG. 2J, the gate material layer 170 is etched to form a gate 170a according to the pattern of the fourth patterned SiN layer 180a. After the gate 170a is formed, the step of removing the fourth patterned SiN layer 180a is preferably further included. Thus, a gate structure whose line width approximately ranges between 10 nm~60 nm is formed.

Next, ions are implanted in the fin-shaped structure 112 to the two sides of the gate 170a to form a source/drain 190 as indicated in step 309. Thus, the main structure of the NAND gate memory of the vertical channel transistor structure 100 is formed. The present embodiment of the invention is exemplified by the formation of an N-type channel transistor, so N-type dopants are used in the present step. However, if a P-type channel transistor is to be formed, then P-type dopants are used in the present step.

Second Embodiment

Figure 4A:
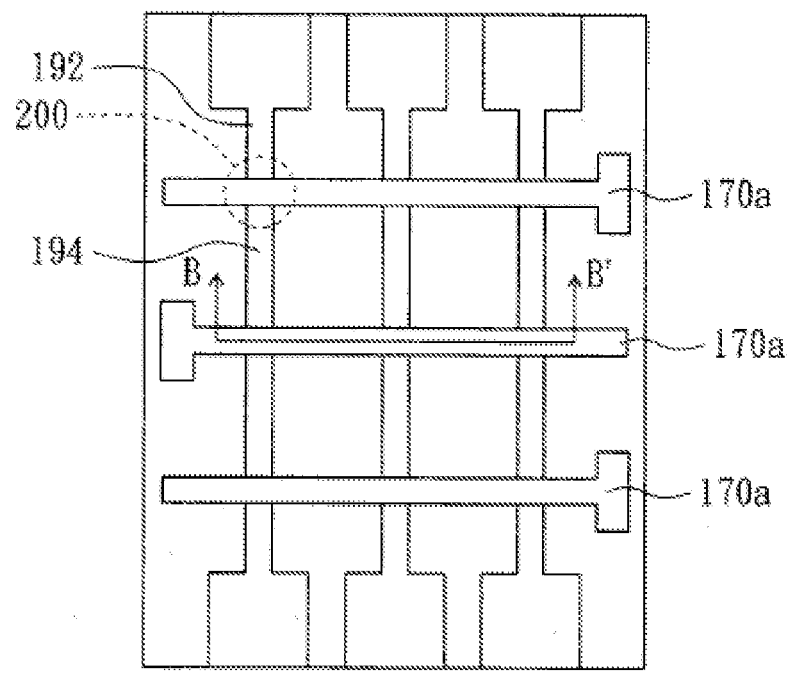
FIG. 4A is a top view of the vertical channel transistor structure according to a second embodiment of the invention.
Figure 4B:
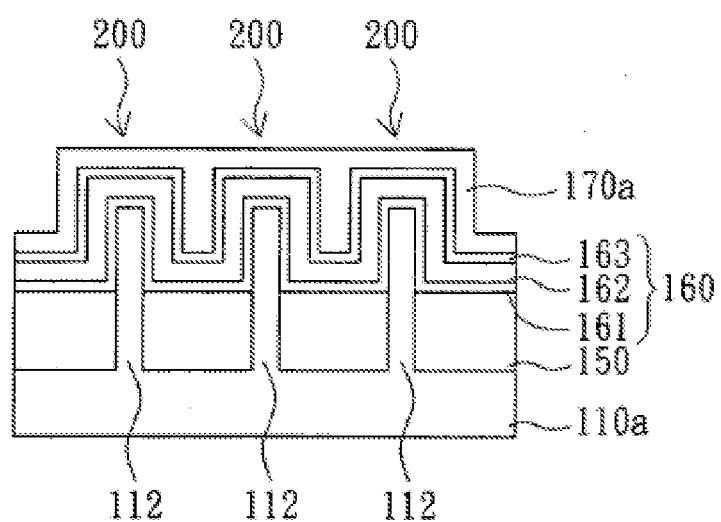
FIG. 4B is a cross-sectional view along a cross-sectional line BB' of FIG. 4A.

Referring to FIG. 4A and FIG. 4B. FIG. 4A is a top view of the vertical channel transistor structure according to a second embodiment of the invention. FIG. 4B is a cross-sectional view along a cross-sectional line BB' of FIG. 4A. The vertical channel transistor structure 200 of the present embodiment differs with the vertical channel transistor structure 100 of first embodiment in that the cap layer 140 is removed. As for other elements, the vertical channel transistor structure 200 and the vertical channel transistor structure 100 are substantially the same, so the same reference numbers are used and their functions are not repeated here.

As the oxide layer 140 is removed, the gate 170a can turn on the circuit on the top surface of the fin-shaped structure 112, and the structure formed thereby is called the tri-gate structure.

The application of the present embodiment of the invention is again exemplified by the manufacturing process of a NAND gate memory array structure (NAND memory). Referring to FIGS. 5A-5J, manufacturing procedures of the vertical channel transistor structure according to the second embodiment are shown. Also referring to FIG. 6, a step flow-chart of manufacturing the vertical channel transistor structure according to the second embodiment is shown.

Figure 5A:
FIG. 5A~5J are manufacturing procedures of the vertical channel transistor structure according to the second embodiment.
Figure 6:
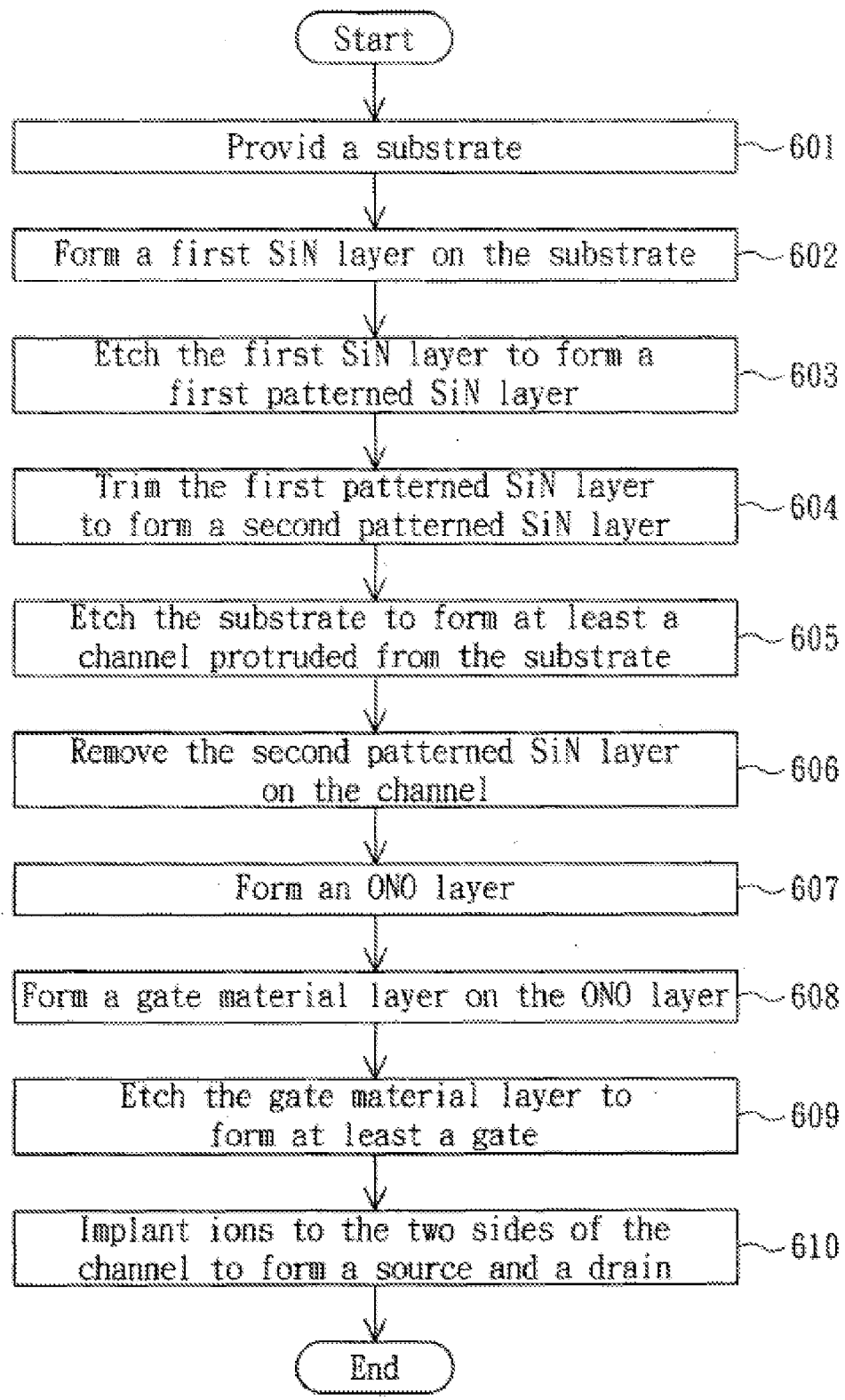
FIG. 6 is a step flowchart of manufacturing the vertical channel transistor structure according to the second embodiment.

First, referring to FIG. 5A, a substrate 110 is provided as indicated in step 601.

Figure 5B:
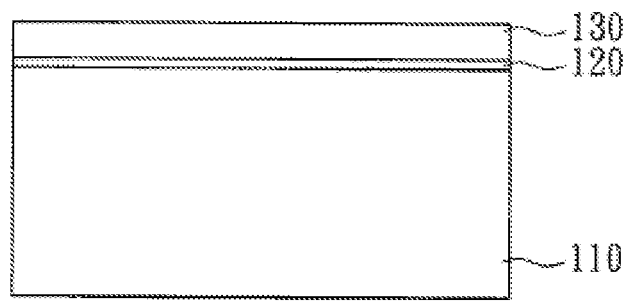

Next, referring to FIG. 5B, a first SiN layer 130 is formed on the substrate 110 as indicated in step 602. In the present embodiment of the invention, a pad SiO layer 120 is preferably formed between the substrate 110 and the first SiN layer 130. Furthermore, in the present step, P-type ions are implanted to the substrate 110 for enabling the substrate 110 to have better function in subsequent processing of forming the channel. However, the present embodiment of the invention is not limited thereto. If a transistor with P-type channel is to be formed, then N-type ions are implanted to the substrate 110.

Figure 5C:
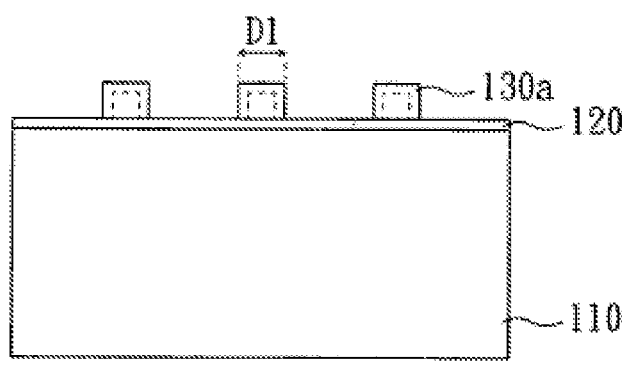

Then, referring to FIG. 5C, the first SiN layer 130 is etched to form a first patterned SiN layer 130a as indicated in step 603. Step 603 includes the following steps of forming a first patterned photoresist layer (not illustrated) on the first SiN layer 130; etching the first SiN layer 130 to form a first patterned SiN layer 130a; and removing the first patterned photoresist layer. The first patterned SiN layer 130a has a pattern with line width D1.

Figure 5D:
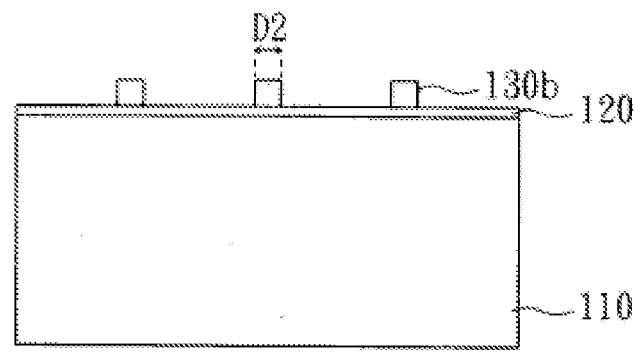

Next, referring to FIG. 5D, the first patterned SiN layer 130a is trimmed to form a second patterned SiN layer 130b as indicated in step 604. The second patterned SiN layer 130b has a pattern with line width D2. The line width D2 approximately ranges between 10 nm~60 nm.

Figure 5E:
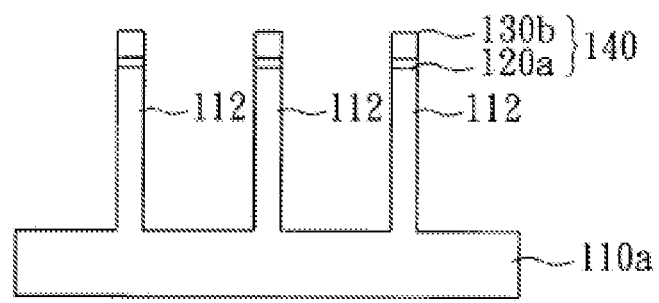

Then, referring to FIG. 5E, the substrate 110 is etched to form a substrate 110a and form a fin-shaped structure 112 protruding from the substrate 110a as indicated in step 605. In the present embodiment of the invention, the pad SiO layer 120 is preferably etched to form a pad SiO layer 120a according to RIE method first, then the substrate 110 is etched to form a fin-shaped structure 112 next. Meanwhile, the pad SiO layer 120a and the second patterned SiN layer 130b together form the cap layer 140.

Figure 5F:
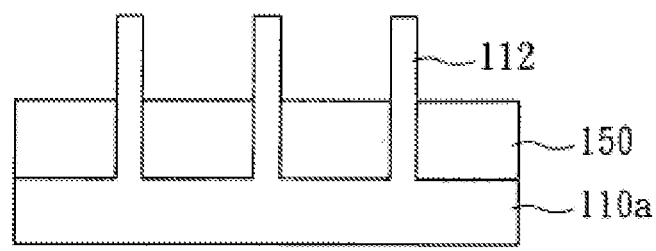

Next, referring to FIG. 5F, a thick SiO layer 150 preventing lower portions of the vertical surfaces of the fin-shaped structure 112 being turned on is formed. Meanwhile, like step 606, the second patterned SiN layer 130b on the fin-shaped structure 112 is removed by hot-phosphoric-acid ($H_3PO_4$), and the pad SiO layer 120a is preferably removed by hydrofluoric acid (HF). The step of removing the second patterned SiN layer 130b and the pad SiO layer 120a can be performed before or after the step of forming the thick SiO layer 150.

Figure 5G:
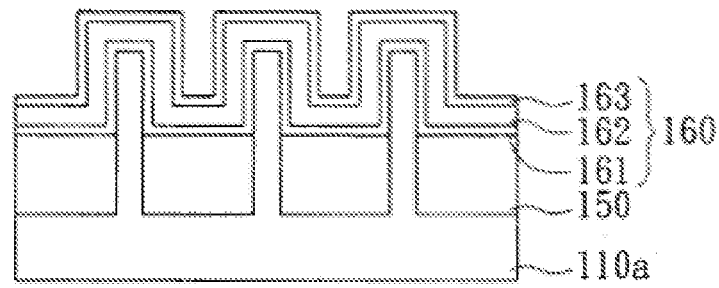

Then, referring to FIG. 5G, an oxide-nitride-oxide (ONO) layer 160 is formed as indicated in step 607. The ONO layer 160 is deposited on the top surface, side wall vertical surfaces of fin-shaped structure 112 and on the thick SIO layer 150. The ONO layer 160 includes a first. SiO layer 161, a charge trapping layer 162 and a second SiO layer 163. In the present embodiment of the invention, the charge trapping layer 162 can be made from SiN or aluminum oxide ($Al_2O_3$) or other high dielectrical constant material.

Figure 5H:
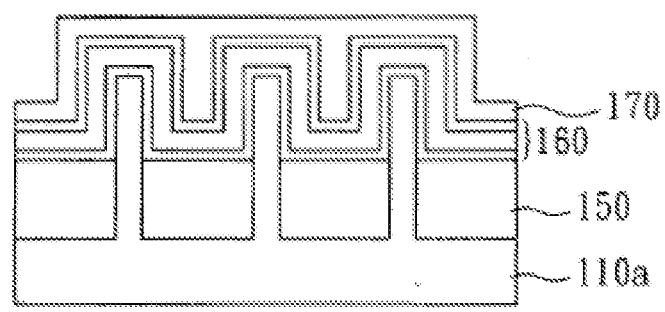

Next, referring to FIG. 5H, a gate material layer 170 is formed on the ONO layer 160 as indicated in step 608.

Figure 5I:
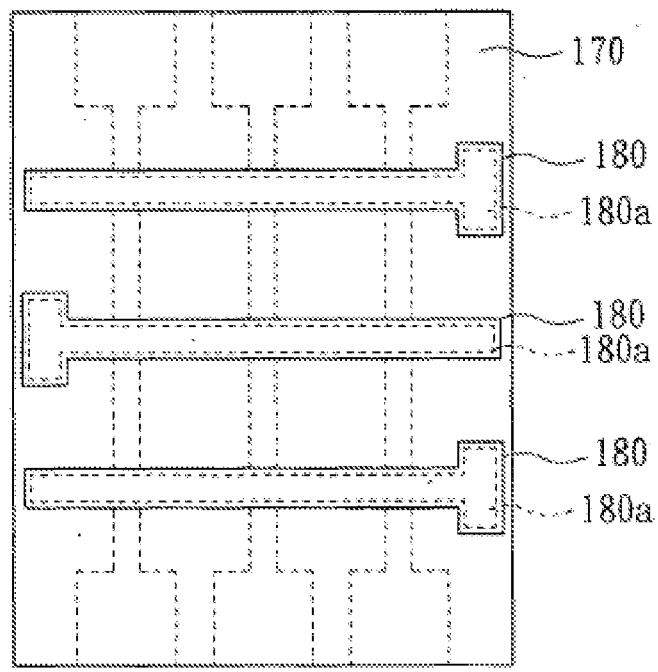
Figure 5J:
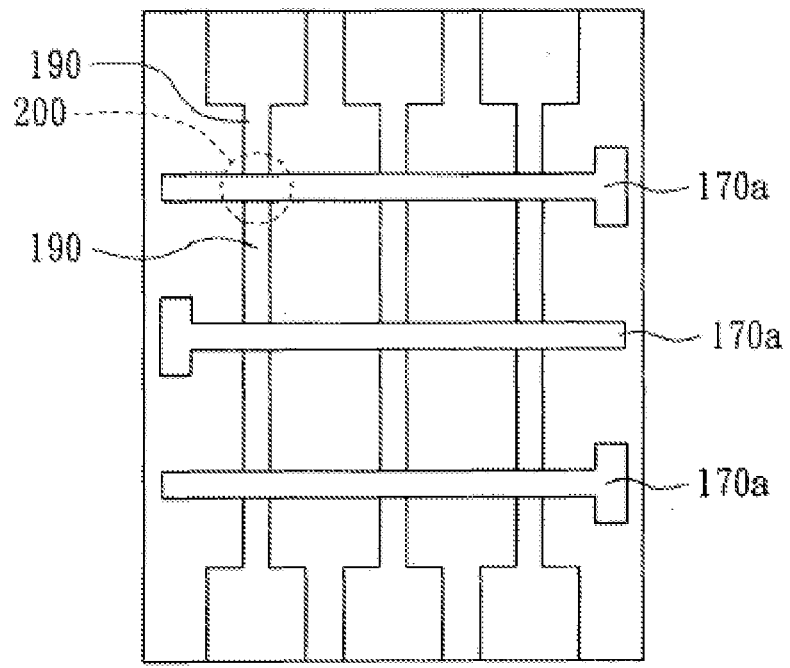

Then, referring to FIG. 5I, the gate material layer 170 is etched to form at least a gate positioned on the top surface of fin-shaped structure 112 and the vertical surfaces of the fin-shaped structure 112 as indicated in step 609. Preferably, the following steps are performed before step 609. First, a second SiN layer (not illustrated) is formed on the gate material layer 170. Next, a second patterned photoresist layer (not illustrated) is formed on the second SiN layer. Then, the second SiN layer is etched to form a third patterned SiN layer 180. Next, the second patterned photoresist layer is removed. Then, the third patterned SiN layer 180 is trimmed to form a fourth patterned SiN layer 180a. Then, referring to FIG. 2J, the gate material layer 170 is etched to form the gate 170a according to the pattern of the fourth patterned SiN layer 180a. After the gate 170a is formed, the step of removing the fourth patterned SiN layer 180a is preferably further included.

Next, proceeding to step 610, ions are implanted on the fin-shaped structure 112 on the two opposing sides of the gate 170a to form a source/drain 190. Thus, the main structure of the vertical channel transistor structure 200 of the NAND memory is formed.

According to the vertical channel transistor structure and manufacturing method thereof disclosed in the above embodiments of the invention, the line width of the pattern formed by SiN is further reduced by hot-phosphoric-acid, and the vertical channel transistor structure whose fin-shaped structure width ranges between 10 nm~60 nm is manufactured without changing the current exposing apparatus, that is, without changing the pitch of the element formed by way of exposing. The invention effectively increases the driving current for writing/reading data without increasing short channel effect or DIBL effect. The fin FET transistor formed according to the invention is small-sized, so the memory density is improved significantly. A transistor with a narrow fin-shaped structure can be manufactured according to the technology of the invention in large scale production and at low cost without employing expensive exposing apparatus. The invention adopts SiN as a hard mask and has better performance in resisting ion impact than a conventional photoresist layer. Thus, uniform semiconductor elements can be formed by way of etching without increasing the thickness of photoresist layer according to the technology of the invention.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

The invention claimed is:

1. A vertical channel transistor array, comprising:
a substrate;
a plurality of channels protruded from the substrate;
a plurality of cap layers on the plurality of channels, wherein cap layers in the plurality of cap layers and channels in the plurality of channels substantially have the same width, wherein the cap layers comprise a silicon nitride (SiN) layer positioned on a silicon dioxide (SiO2) layer, and the SiN layer has a top surface and two vertical surfaces;

a multilayer charge trapping layer directly on the top surface and the two vertical surfaces of the SiN layer of the plurality of cap layers and on two vertical surfaces of the channels in the plurality of channels, the multilayer charge trapping layer including at least a first oxide layer, a first charge trapping layer on the first oxide layer, and a second oxide layer on the first charge trapping layer;

a plurality of word lines, word lines in the plurality of word lines straddling on the multilayer charge trapping layer and positioned on the two vertical surfaces of the channels in the plurality of channels; and sources and drains respectively positioned on the two vertical sides of the channels in the plurality of channels, wherein a channel in the plurality of channels in between adjacent ones of the sources and the drains, and in between the substrate and a word line of the plurality of word lines, supports only one transistor, wherein the array is arranged as a plurality of series-connected NAND strings having opposite ends that end in transistors, and every transistor in the plurality of series-connected NAND strings includes one of the cap layers in the plurality of cap layers that comprises the silicon dioxide (SiO2) layer and the silicon nitride (SiN) layer.

2. The vertical channel transistor array according to claim 1, further comprising a thick silicon oxide (SiO) layer positioned on the substrate.

3. The vertical channel transistor array according to claim 1, wherein the first charge trapping layer is made from SiN or aluminum oxide ($Al_2O_3$).

4. The vertical channel transistor array according to claim 1, wherein the substrate is a bulk silicon substrate or a silicon-on-insulator (SOI) substrate.

5. The vertical channel transistor array according to claim 1, wherein the gate is made from N+ polysilicon, P+ polysilicon, or metal.

6. The vertical channel transistor array according to claim 1, wherein a line width of the channel approximately ranges between 10 nm~60 nm.

* * * * *